United States Patent
Kim et al.

(10) Patent No.: US 9,251,863 B2
(45) Date of Patent: Feb. 2, 2016

(54) MULTI CHANNEL SEMICONDUCTOR MEMORY DEVICE AND SEMICONDUCTOR DEVICE INCLUDING THE SAME

(71) Applicant: Samsung Electronics Co., Ltd., Suwon-si (KR)

(72) Inventors: Hyun-Joong Kim, Yongin-si (KR); Dongyang Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/268,675

(22) Filed: May 2, 2014

(65) Prior Publication Data

US 2014/0241024 A1    Aug. 28, 2014

Related U.S. Application Data

(63) Continuation of application No. 13/298,653, filed on Nov. 17, 2011, now Pat. No. 8,717,828.

(30) Foreign Application Priority Data

Nov. 30, 2010    (KR) .......................... 10-2010-0120688

(51) Int. Cl.
*G11C 7/00* (2006.01)
*G11C 5/06* (2006.01)
*H01L 25/065* (2006.01)

(52) U.S. Cl.
CPC ............ *G11C 5/063* (2013.01); *H01L 25/0657* (2013.01); *H01L 2225/06541* (2013.01); *H01L 2225/06565* (2013.01); *H01L 2924/0002* (2013.01)

(58) Field of Classification Search
CPC .......................... G11C 7/10–7/14; G11C 7/22
See application file for complete search history.

(56) References Cited

U.S. PATENT DOCUMENTS

| | | | |
|---|---|---|---|
| 6,125,421 A | 9/2000 | Roy | |
| 6,414,904 B2 | 7/2002 | So et al. | |
| 8,717,828 B2 | 5/2014 | Kim et al. | |
| 2002/0001214 A1 | 1/2002 | So et al. | |

(Continued)

FOREIGN PATENT DOCUMENTS

| | | |
|---|---|---|
| CN | 1332457 | 1/2002 |
| JP | 4027377 | 10/2007 |

(Continued)

OTHER PUBLICATIONS

Office Action from corresponding application No. CN 201110412500.2 dated Nov. 25, 2014.

(Continued)

*Primary Examiner* — Son Dinh
*Assistant Examiner* — Uyen B Tran
(74) *Attorney, Agent, or Firm* — Onello & Mello, LLP

(57) ABSTRACT

Disclosed is a semiconductor memory device that includes a plurality of channel memories mounted within a package and is capable of minimizing or reducing the number of through-silicon vias. With the semiconductor memory device, a row command or a row address on two or more channels is applied through a shared bus. The semiconductor memory device is capable of reducing an overhead of a die size by reducing the number of through-silicon vias. A method of driving a multi-channel semiconductor memory device including a plurality of memories, using a shared bus, is also provided.

10 Claims, 10 Drawing Sheets

(56) References Cited

U.S. PATENT DOCUMENTS

| | | |
|---|---|---|
| 2005/0007835 A1* | 1/2005 | Lee et al. ............... 365/189.12 |
| 2005/0024963 A1* | 2/2005 | Jakobs et al. ............... 365/202 |
| 2006/0149857 A1 | 7/2006 | Holman |
| 2006/0282593 A1 | 12/2006 | Crane, Jr. et al. |
| 2007/0162689 A1 | 7/2007 | Choi |
| 2008/0126604 A1 | 5/2008 | Kim et al. |
| 2008/0172500 A1 | 7/2008 | Im |
| 2009/0129179 A1* | 5/2009 | Yamazaki ............... 365/194 |
| 2009/0219779 A1 | 9/2009 | Mao et al. |
| 2010/0030980 A1 | 2/2010 | Yamada et al. |
| 2010/0195364 A1 | 8/2010 | Riho |
| 2010/0214812 A1 | 8/2010 | Kim |

FOREIGN PATENT DOCUMENTS

| | | |
|---|---|---|
| KR | 10-0335504 | 4/2002 |
| KR | 10-2008-0067506 | 7/2008 |

OTHER PUBLICATIONS

"Multi Channel Semiconductor Memory Device and Semiconductor Device Including the Same" Specification, Drawings, and Prosecution History, of U.S. Appl. No. 13/298,653, filed Nov. 17, 2011, by Hyun-Joong Kim, et al.

\* cited by examiner

MULTI CHANNEL SEMICONDUCTOR MEMORY DEVICE AND SEMICONDUCTOR DEVICE INCLUDING THE SAME

CROSS-REFERENCE TO RELATED APPLICATIONS

This application is a continuation application of U.S. patent application Ser. No. 13/298,653, filed on Nov. 17, 2011, which claims the benefit, under 35 U.S.C §119, to Korean Patent Application No. 10-2010-0120688, filed Nov. 30, 2010, the contents of which applications are incorporated herein in their entirety by reference.

FIELD

Exemplary embodiments relate to a data storage device, and more particularly, relate to a multi-channel semiconductor memory device having a plurality of stacked channel memories, a semiconductor device including the same, and a method of driving such channel memories.

BACKGROUND

As electronic devices become lighter, thinner, shorter, and smaller, an important factor in achieving such reductions is high density mounting of semiconductor packages, as key components of such electronic devices.

In a computer or other electronic device, sizes of semiconductor devices, such as a random access memory (RAM) and a flash memory, increase to achieve an increase in memory capacity, while packages are miniaturized. Approaches for reducing package size have been developed. For example, according to one approach, a stack-type semiconductor package is configured to include a plurality of stacked semiconductor chips or semiconductor device packages. According to another approach, a semiconductor module having a plurality of semiconductor chips, a plurality of semiconductor device packages, and/or stack-type semiconductor packages are mounted on at least one surface of a printed circuit board (PCB).

Such packages may be classified into a semiconductor chip stack-type package, which is identical to a multi-chip package (MCP) including a plurality of semiconductor chips having different functions. The semiconductor chip stack-type package includes a plurality of stacked semiconductor chips to realize a high capacity.

The semiconductor chip stack-type package may be a product or application of a three-dimensional (3D) arrangement technique. With the 3D arrangement technique, a plurality of memory chips is stacked to improve the integrity of a semiconductor memory. As a semiconductor chip stack-type package, a multi-channel DRAM device is developed to satisfy a need for high-density and high-capacity memories and to improve system performance.

Since a multi-channel semiconductor memory device has a structure wherein a plurality of semiconductor chips (or channel memories) is stacked, through-silicon vias (TSVs) may be applied to the multi-channel semiconductor memory device. A through-silicon via may be used as conductive lines between a plurality of memories. The through-silicon via may function as a signal transfer line for transferring a command signal or an address signal applied from a memory controller or a line for transferring data.

In such channel memories, a plurality of vias is formed at semiconductor chips to penetrate a die vertically.

In a conventional multi-channel DRAM device, since a command signal and an address signal are applied to each memory device independently, each channel coupled with each memory necessitates dedicated command and address transfer lines. Accordingly, a die area occupied by through-silicon vias is relatively large. For example, if a command/address line number per channel is 23 and a channel number is 16, one die may require 368 through-silicon vias.

An increase in the number of through-silicon vias causes an increase in chip die size. As a result, a yield of a multi-channel semiconductor memory device is lowered and cost is increased.

SUMMARY

One aspect of the inventive concept is directed to control a plurality channel memories using fewer lines.

Another aspect of the inventive concept is directed to reduce the number of through-silicon vias penetrating a plurality of channel memories.

Still another aspect of the inventive concept is directed to the transfer of a row command signal or a row address signal on a plurality of channel memories through a shared bus.

Still another aspect of the inventive concept is directed to reduce a die size and to improve a yield by reducing the number of through-silicon vias penetrating a plurality of channel memories stacked vertically.

According to one particular aspect of the inventive concept, provided is a semiconductor memory device which comprises a first memory configured to receive a first channel row command through a first bus and a first channel column command through a second bus, respectively; and a second memory connected with the first memory by a through-silicon via, wherein the second memory is configured to receive a second channel column command through a dedicated bus, and a second channel row command through one of the first and second buses of the first memory.

In various embodiments, each of the row commands can include an active command and a pre-charge command, and each of the column commands can include a write command and a read command.

In various embodiments, the second bus can be a shared bus arranged to transfer the first channel row command and the second channel row command, and the shared bus is formed of the through-silicon via.

In various embodiments, the first memory can be a dynamic random access memory having a plurality of memory banks.

In various embodiments, the first channel row command and the first channel column command can be generated by a first scheduler of at least one memory controller, and the second channel row command and the second channel column command can be generated by a second scheduler of the at least one memory controller.

According to another aspect of the inventive concept, provided is a semiconductor memory device which comprises a first memory configured to receive a first channel column address and a first channel row address through a first bus and a second bus, respectively; and a second memory connected with the first memory by a through-silicon via, the second memory device configured to receive a second channel column address through a dedicated bus, and a second channel row address through one of the first and second buses of the first memory.

In various embodiments, the second bus can be a shared bus a bus arranged to transfer the first channel row address and the second channel row address, and the shared bus can be formed of the through-silicon via.

In various embodiments, the first and second memories are each a dynamic random access memory having a plurality of memory banks.

In various embodiments, the first channel row address and the first channel column address can be generated by a first scheduler of at least one memory controller, and the second channel row address and the second channel column address can be generated by a second scheduler of the at least one memory controller.

According to still another aspect of the inventive concept, provided is a semiconductor device comprising a memory controller including a first control unit and a second control unit, and a semiconductor memory device including a first memory and a second memory. The first control unit is configured to generate a first row command and a first row address on a first channel and a first column command and a first column address on the first channel. And the second control unit is configured to generate a second row command and a second row address on a second channel and a second column command and a second column address on the second channel. The first memory and the second memory form a stacked structure. The first memory is configured to receive the first column command and the first column address of the first channel through first dedicated bus lines and the first row command and the first row address on the first channel through shared bus lines, and the second memory is configured to receive the second column command and the second column address of the second channel through second dedicated bus lines and the second row command and the second row address on the second channel through the shared bus lines.

In various embodiments, the memory controller and the semiconductor memory device can be included within a same package.

In various embodiments, the first and second control units can be channel schedulers configured to control the first and second memories, respectively.

In various embodiments, the shared bus lines can be fondled of a through-silicon via (TSV).

In various embodiments, the semiconductor memory device can further include channel memories stacked on a stacked structure of the first and second memories.

According to still another aspect of the inventive concept, provided is a semiconductor memory device that comprises a first memory configured to receive a first channel row address or a first channel row command and a first channel column address or a first channel column command through first and second buses, respectively; and a second memory connected with the first memory by a through-silicon via, the second memory configured to receive a second channel row command or a second channel row address through a dedicated bus, and to receive a second column command or a second column address through one of the first and second buses of the first memory.

In various embodiments, the semiconductor memory device can be configured to have 128 data bits per channel for a wide data input/output In various embodiments, each of the row commands can include an active command and a pre-charge command, and each of the column commands can include a write command and a read command.

In accordance with yet another aspect of the inventive concept, provided is a memory driving method of a multi-channel semiconductor memory device including a plurality of memories. The memory driving method comprises applying a first row command and a first row address through a shared bus during a first period, to drive one of the plurality of memories; and applying a second row command and a second row address through the shared bus during a second period that is not overlapped with the first period, to drive a second memory of the plurality of memories.

In various embodiments, a first column command and a first column address of the first memory can be applied through a first dedicated bus, and a second column command and a second column address of the second memory can be applied through a second dedicated bus.

In various embodiments, a minimum time of each of the first and second periods is 1tCK, i.e., 1 time tCK, where tCK is the duration of one clock cycle.

In accordance with another aspect of the present invention, provided is a semiconductor device comprising a memory controller including a plurality of control units; a semiconductor memory device including a plurality of memories; and a plurality of buses coupling the plurality of control units to the plurality of memories. The plurality of buses includes a shared bus and at least two dedicated buses coupling at least two control units to at least two memories, and the shared bus is configured to transfer either all row or all column command signals and address signals for each of the at least two control units to each of the at least two memories.

In various embodiments, a number of control units in the plurality of control units and a number of memories in the plurality of memories can be the same.

In various embodiments, there can be a different dedicated bus between each of the at least two control units and a corresponding one of the at least two control units.

In various embodiments, the column command signals and column address signals can be transferred on the shared bus.

In various embodiments, each of the column command signals can include a write command and a read command.

In various embodiments, the row command signals and row address signals can be transferred on the shared bus.

In various embodiments, each of the row command signals can include an active command and a pre-charge command.

In various embodiments, the plurality of memories can include a dynamic random access memory having a plurality of memory banks.

In various embodiments, the shared bus can be formed of a through-silicon via (TSV).

In various embodiments, the at least two memories can be arranged in a stacked structure as channel memories.

BRIEF DESCRIPTION OF THE FIGURES

Aspects of the present inventive concepts will become apparent from the following description with reference to the following figures, wherein like reference numerals refer to like parts throughout the various figures unless otherwise specified, and wherein.

DETAILED DESCRIPTION

Figure 1:
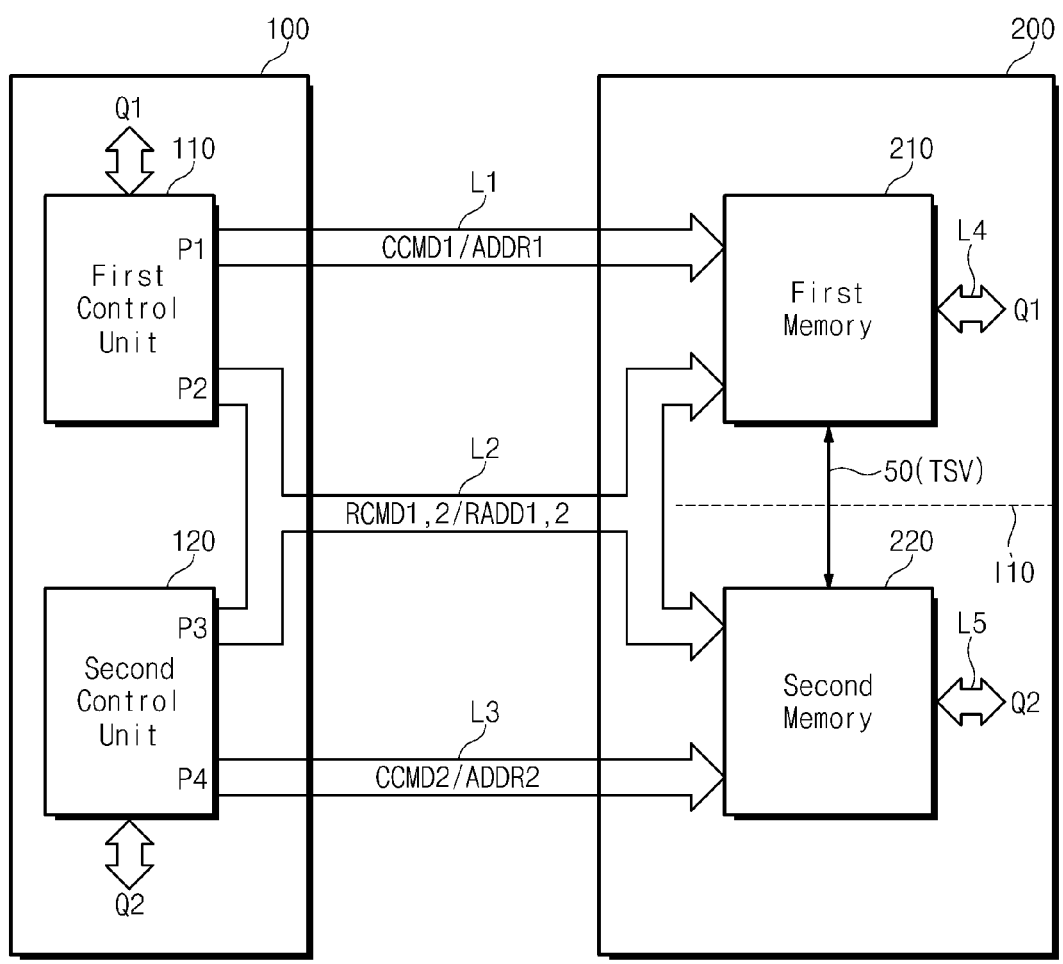
FIG. 1 is a block diagram of an exemplary embodiment of a semiconductor device, according to aspects of the inventive concept.

Various exemplary embodiments are described more fully hereinafter with reference to the accompanying drawings. The inventive concept may, however, be embodied in many different forms and should not be construed as limited to the embodiments set forth herein. In the drawings, like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (e.g., rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Embodiments described and illustrated herein may include complementary embodiments. Note that general read and write operations of a conventional RAM family of semiconductor devices, operations of applying commands and addresses, and a control method thereof may be skipped in accordance with the present invention, which could prevent semiconductor devices in accordance with inventive concept from becoming imprecise.

FIG. 1 is a block diagram of an exemplary embodiment of a semiconductor device, according to aspects of the inventive concept.

Referring to FIG. 1, a semiconductor device may include a memory controller 100 and a semiconductor memory device 200.

If the memory controller 100 includes first and second control units 110 and 120, then the semiconductor memory device 200 may include corresponding first and second memories 210 and 220.

As a first scheduler of the memory controller 100, the first control unit 110 may generate a row command signal RCMD1 and a row address signal RADD1 on a first channel and also generate a column command signal CCMD1 and a column address signal ADDR1 on the first channel.

As a second scheduler of the memory controller 100, the second control unit 120 may generate a row command signal RCMD2 and a row address signal RADD2 on a second channel and also generate a column command signal CCMD2 and a column address signal ADDR2 on the second channel.

Buses L1, L2, and L3 disposed between the memory controller 100 and the semiconductor memory device 200 may represent a first dedicated bus, a shared bus, and a second dedicated bus, respectively. One bus may be formed of scores of signal transfer lines, as would be understood by those skilled in the art.

The first dedicated bus L1 may be a bus for transferring the column command signal CCMD1 and column address signal ADDR1 on the first channel output from a port P1 of the first control unit 110. In FIG. 1, one bus line is shown for ease of illustration. But the first dedicated bus L1 may be formed of a command bus and an address bus. Each of the command and address buses may be formed of a plurality of signal transfer lines, as would be understood by those skilled in the art.

The second dedicated bus L3 may be a bus for transferring the column command signal CCMD2 and column address signal ADDR2 on the second channel output from a port P4 of the second control unit 120. In FIG. 1, one bus line is shown for ease of illustration. But the second dedicated bus L3 may be formed of a command bus and an address bus. Each of the command and address buses may be formed of a plurality of signal transfer lines, as would be understood by those skilled in the art.

The shared bus L2 may be a bus for transferring row command signals RCMD 1 and RCMD 2 and row address signals RADD1 and RADD2 on the first and second channels output from ports P2 and P3 of the first and second control units 110 and 120, respectively. In FIG. 1, one bus line is shown for ease of illustration. But the shared bus L2 may be formed of a row command bus and a row address bus. Each of the row command and row address buses may be formed of a plurality of signal transfer lines, as would be understood by those skilled in the art.

Herein, the first and second control units 110 and 120 may use the shared bus L2 in common. The shared bus L2 is shown to be a bus line, but it may be formed of two shared bus lines, where it could include one bus for transferring a row command signal RCMD 1 and RCMD 2 and another bus for transferring row address signals RADD1 and RADD2.

The first and second memories 210 and 220 may be disposed on different dies to be stacked with an interposed isolation layer 110.

The first memory 210 may receive the column command signal CCMD1 and the column address signal ADDR1 on the first channel through the first dedicated bus L1 and the row command signal RCMD 1 and the row address signal RADD1 on the first channel through the shared bus L2.

The second memory 220 may form a stack structure with the first memory 210. The second memory 220 may receive the column command signal CCMD2 and the column address signal ADDR2 on the second channel through the second dedicated bus L3 and the row command signal RCMD 2 and the row address signal RADD2 on the second channel through the shared bus L2.

Since the semiconductor memory device 200 has a structure wherein a plurality of semiconductor chips (or channel memories) is stacked, it may correspond to or form a multi-channel semiconductor memory device. As a signal transfer line, a through-silicon via 50 may be used to transfer a command signal and an address signal to an upper channel memory through a lower channel memory. That is, a through-silicon via can be used to connect the first and second memories 210 and 220, as shared bus L2. The first and second memories 210 and 220 may share the shared bus L2 to reduce the number of through-silicon vias penetrating a silicon layer. As a result, it is possible to reduce the number of signal bus lines of a multi-channel semiconductor memory device by transferring row command signals RCMD 1, 2 on the first and second channels through the shared bus L2 and transferring a row address signal RADD1, 2 on the first and second channels through the shared bus L2.

In FIG. 1, buses L4 and L5 may be the first and second channel data input/output buses. Bus L4 is coupled to first memory 210 and bus L5 is coupled to second memory 220.

In the exemplarily embodiment described in FIG. 1, there is provided an example of a semiconductor memory device 200 that is formed of two stacked memories. But it is well understood that the semiconductor memory device 200 can be formed of more stacked channel memories to achieve a higher density and higher capacity. In this case, the number of control units within the memory controller 100 may increase in proportion to the number of channel memories within the semiconductor memory device 200.

Figure 2:
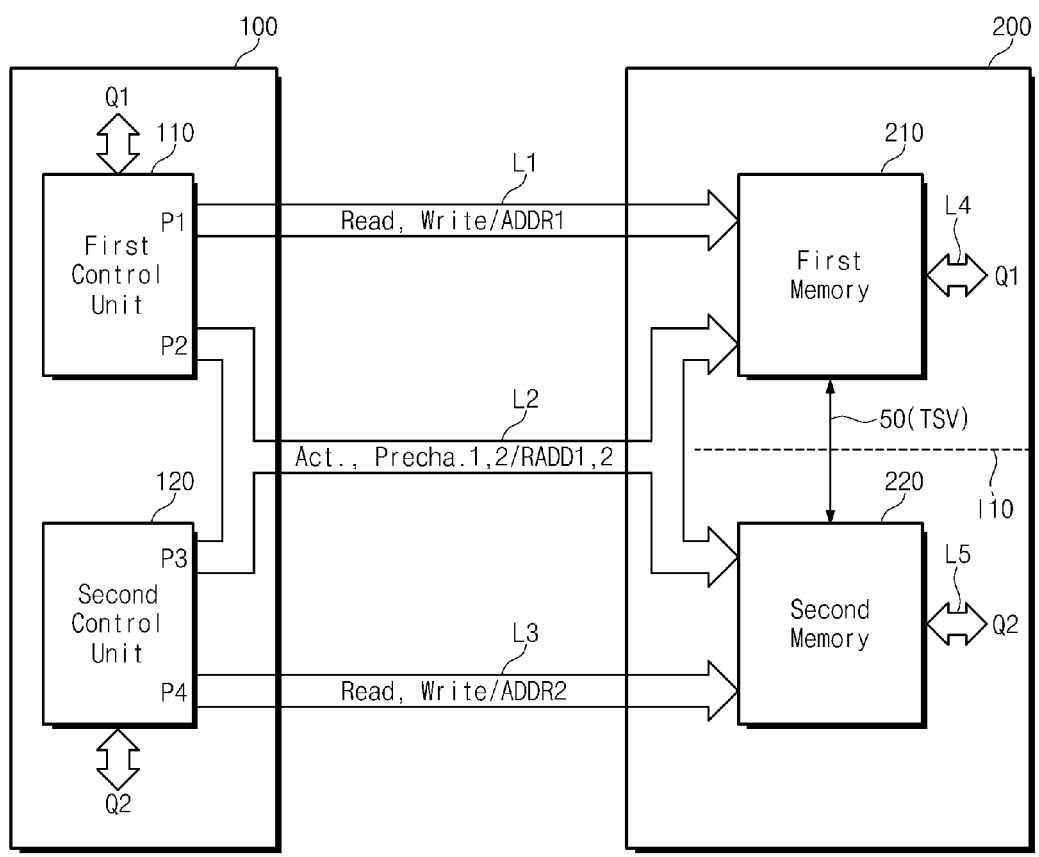
FIG. 2 is a block diagram of an embodiment of the semiconductor device of FIG. 1, used for describing an embodiment of detailed column and row command buses, according to aspects of the inventive concept.

FIG. 2 is a block diagram of the semiconductor device of FIG. 1 used for describing detailed column and row command buses, according to aspects of the inventive concept. As is shown in the embodiment of FIG. 2, the row command signals RCMD 1, 2 may include active and pre-charge commands, and the column command signals CCMD1, 2 may include write and read commands.

In FIG. 2, the first dedicated bus for transferring the first channel column command signal CCMD1 is illustrated as bus L1 (also refer to FIG. 1), which is used for read and write commands of the first channel. The second dedicated bus for transferring the second channel column command signal CCMD2 is illustrated as bus L3 (again, also refer to FIG. 1), and is used for read and write commands of the second channel.

A shared bus for transferring the first and second row command signals RCMD 1, 2 is illustrated as bus L2 (also refer to FIG. 1), and is used for active and pre-charge commands of the first and second channels.

Shared bus L2 can be referred to as an active and pre-charge command bus L2 or a row command bus L2, depending on the type of command signal being communicated over shared bus L2. The active and pre-charge command bus and the row address bus are used in common by the first and second memories 210 and 220, as shared bus L2. As a result of using a shared bus, the number of through-silicon vias is reduced.

As exemplarily illustrated in the embodiment of FIG. 2, the active and pre-charge command bus L2, as the row command bus, is used as a shared bus with respect to the first and second memories 210 and 220, or the row address bus L2 is used as a shared bus with respect to the first and second memories 210 and 220.

Figure 3:
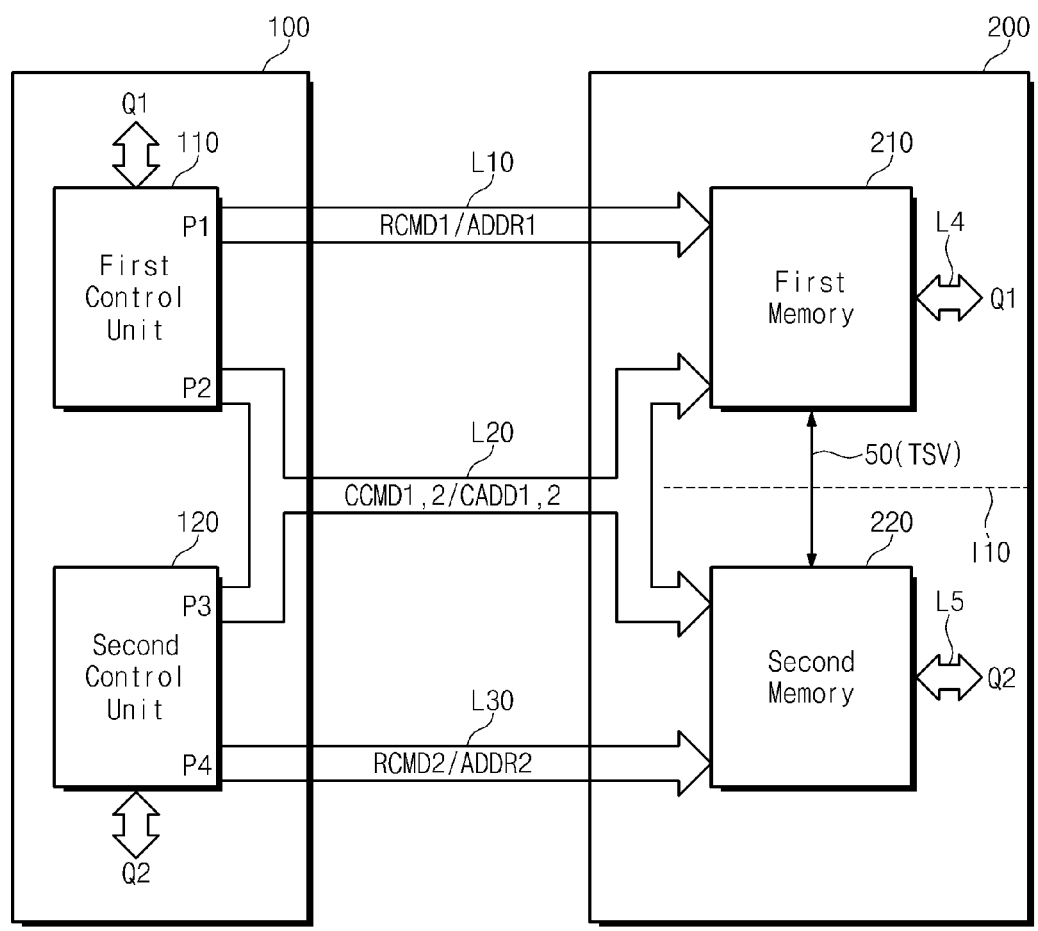
FIG. 3 is a block diagram of another exemplary embodiment of a semiconductor device, according to aspects of the inventive concept.

FIG. 3 is a block diagram of another embodiment of a semiconductor device, according to aspects of the inventive concept. Unlike the embodiment of FIG. 2, a shared bus can be used as a column command bus and a column address bus.

Referring to FIG. 3, a semiconductor device may include a memory controller 100 and a semiconductor memory device 200, such as those in the embodiment of FIG. 1.

In this embodiment, the memory controller 100 includes the first and second control units 110 and 120, just as in FIG. 1. And the semiconductor memory device 200 includes the corresponding first and second memories 210 and 220, also as in FIG. 1.

As a first scheduler of the memory controller 100, the first control unit 110 may generate a row command signal RCMD 1 and a row address signal ADDR1 on the first channel and a column command signal CCMD1 and a column address signal CADD1 on the first channel.

As a second scheduler of the memory controller 100, the second control unit 120 may generate a row command signal RCMD 2 and a row address signal ADDR2 on the second channel and a column command signal CCMD2 and a column address signal CADD2 on the second channel.

Buses L10, L20, and L30, like buses L1, L2, and L3 in FIG. 1, are disposed between the memory controller 100 and the semiconductor memory device 200, and may represent a first dedicated bus, a shared bus, and a second dedicated bus, respectively. One bus may be formed of a plurality of signal transfer lines, as would be understood by those skilled in the art.

The first dedicated bus L10 may be a bus for transferring the row command signal RCMD 1 and row address signal ADDR1 on the first channel output from a port P1 of the first control unit 110. In FIG. 3, one bus line is shown for ease of illustration. But the first dedicated bus L10 may be formed of a command bus and an address bus. Each of the command and address buses may be formed of a plurality of signal transfer lines, as would be understood by those skilled in the art.

The second dedicated bus L30 may be a bus for transferring the row command signal RCMD2 and row address signal ADDR2 on the second channel output from a port P4 of the second control unit 120. In FIG. 3, one bus line is shown for ease of illustration. But the second dedicated bus L30 may be formed of a command bus and an address bus. Each of the command and address buses may be formed of a plurality of signal transfer lines, as would be understood by those skilled in the art.

The shared bus L20 may be a bus for transferring column command signals CCMD1 and CCMD2 and column address signals CADD1 and CADD2 on the first and second channels output from ports P2 and P3 of the first and second control units 110 and 120, respectively. In FIG. 3, one bus line is shown for ease of illustration. But the shared bus L20 may be formed of a column command bus and a column address bus. Each of the column command and column address buses may be formed of a plurality of signal transfer lines, as would be understood by those skilled in the art.

Herein, the first and second control units 110 and 120 may use the shared bus L20 in common. The shared bus L20 is shown to be a bus line, but it may be formed of two shared bus lines, where it could include one bus for transferring a column command signals CCMD1 and CCMD2 and another bus for transferring column address signals CADD1 and CADD2.

The first and second memories 210 and 220 may be disposed at different dies to be stacked with an interposed isolation layer 110.

The first memory 210 may receive the row command signal RCMD1 and the row address signal ADDR1 on the first channel through the first dedicated bus L10 and the column command signal CCMD1 and the column address signal CADD1 on the first channel through the shared bus L20.

The second memory 220 may form a stack structure with the first memory 210. The second memory 220 may receive the row command signal RCMD 2 and the row address signal ADDR2 on the second channel through the second dedicated bus L30 and the column command signal CCMD2 and the column address signal CADD2 on the second channel through the shared bus L20.

Since the semiconductor memory device 200 has a structure wherein a plurality of semiconductor chips (or channel memories) is stacked, it may correspond to or form a multi-channel semiconductor memory device. As a signal transfer line, a through-silicon via 50 may be used to transfer a command signal and an address signal to an upper channel memory through a lower channel memory. That is, a through-silicon via can be used to connect the first and second memories 210 and 220, as shared bus L20. The first and second memories 210 and 220 may share the shared bus L20 to reduce the number of through-silicon vias penetrating a silicon layer. As a result, it is possible to reduce the number of signal bus lines of a multi-channel semiconductor memory device by transferring the column command signals CCMD1 or CCMD2 on the first and second channels through the shared bus L20 and transferring the column address signals CADD1 and CADD2 on the first and second channels through the shared bus L20.

In FIG. 3, buses L4 and L5 may be the first and second channel data input/output buses. The bus L4 may be coupled with a data port Q1 of the first control unit 110, and the bus L5 may be coupled with a data port Q2 of the second control unit 120. Bus L4 is coupled to first memory 210 and bus L5 is coupled to second memory 220.

In the exemplarily embodiment described in FIG. 3, there is provided an example of a semiconductor memory device 200 that is foamed of two stacked memories. But it is well understood that the semiconductor memory device 200 can be formed of more stacked channel memories for the high density and high capacity. In this case, the number of control units within the memory controller 100 may increase in proportion to the number of channel memories within the semiconductor memory device 200.

Figure 4:
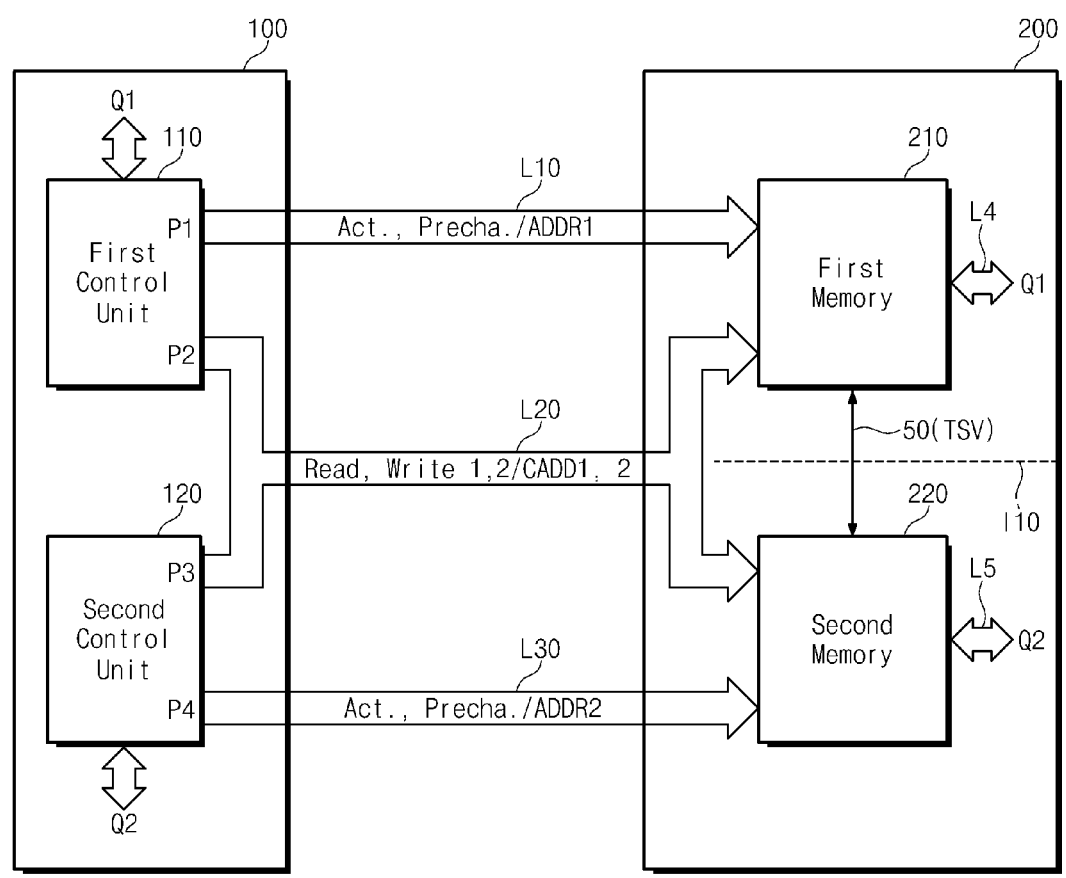
FIG. 4 is a block diagram of an embodiment of the semiconductor device of FIG. 4, used for describing an exemplary embodiment of detailed column and row command buses, according to aspects of the inventive concept.

FIG. 4 is a block diagram of the semiconductor device of FIG. 3, used for describing detailed column and row command buses according to an exemplary embodiment of the inventive concept. As is shown in the embodiment of FIG. 4, the column command signals CCMD1, 2 may include write and read commands, and the row command signals RCMD 1, 2 may include active and pre-charge commands.

In FIG. 4, the first dedicated bus for transferring the first channel row command signal RCMD1 is illustrated as bus L10 (also refer to FIG. 3), which is used for active and pre-charge commands of the first channel. The second dedicated bus for transferring the second channel row command signal RCMD2 is illustrated as bus L30 (again, also refer to FIG. 3) for active and pre-charge commands of the second channel.

A shared bus for transferring the first/second column command signals CCMD1, 2 is illustrated as bus L20 (also refer to FIG. 3), and is used for read and write commands of the first and second channels.

Shared bus L20 can be referred to as a read/write command bus L20 or a column address bus L20, depending on the type of command signal being communicated over shared bus L20. In FIG. 4, the read/write command bus and the column address bus are used in common by the first and second memories 210 and 220, as shared bus L20. As a result of using the shared bus, the number of through-silicon vias may be reduced.

An exemplary embodiment of a detailed structure a semiconductor device illustrated in FIGS. 1 and 2 will be more fully described with reference to FIG. 5. A similar structure could be formed for the semiconductor device of FIGS. 3 and 4, as would be apparent to those skilled in the art.

Figure 5:
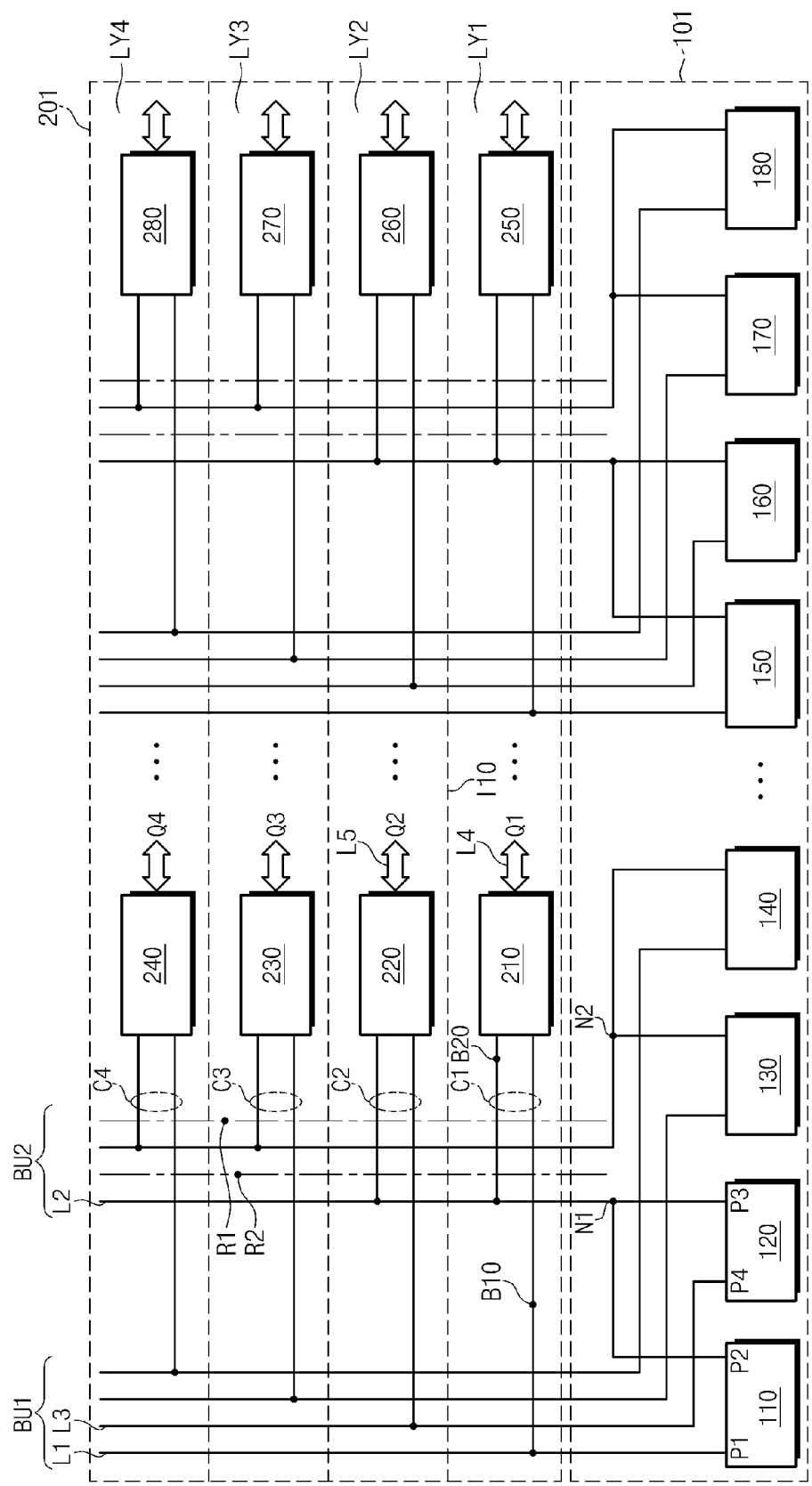
FIG. 5 is a block diagram showing an embodiment of a detailed structure of a semiconductor device, such as those illustrated in FIGS. 1 and 2, according to aspects of the inventive concept.

FIG. 5 is a block diagram showing the exemplary embodiment of a detailed structure of a semiconductor device illustrated in FIGS. 1 and 2.

In FIG. 5, a memory controller 101, which could be the same or similar to memory controller 100 in FIGS. 1 and 2, may include a plurality of control units 110 to 180, such as first and second control units 110 and 120 in FIGS. 1 and 2. And a semiconductor memory device 201, such as semiconductor memory device 200 in FIGS. 1 and 2, may include a plurality of memories 210 to 280, such as first and second memories 210 and 220 in FIGS. 1 and 2.

The plurality of memories 210 to 280 may be disposed at four layers LY1, LY2, LY3, and LY4. The memory controller 101 and the semiconductor memory device 201 may be disposed within one package or within independent packages, respectively.

A bus line L1 in a bus BU1 may correspond to the first dedicated bus L1 in FIGS. 1 and 2. The bus line L1 may be coupled with a port P1 of the control unit 110 and with the first memory 210 via a line connection node B10.

A bus line L3 in the bus BU1 may correspond to the second dedicated bus L3 in FIGS. 1 and 2. The bus line L3 may be connected with a port P4 of the second control unit 120 and with the second memory 220.

In FIG. 5, a bus line L2 in a bus BU2 may correspond to shared bus L2 in FIGS. 1 and 2. The bus line L2 may be formed of a plurality of signal transfer lines. The bus line L2 may be coupled with the first and second memories 210 and 220, as a shared bus. The bus line L2 may be coupled with a connection node N1 to which ports P2 and P3 of the first and second control units 110 and 120 are also connected.

With the above-described bus connection structure, since the first and second memories 210 and 220 use the shared bus L2 in common, a bus line R1 (shown as a dashed line) may not be needed. Further, since the third and fourth memories 230 and 240 use a shared bus connected with a connection node N2 in common, a bus line R2 (shown as a dashed line) may not be needed.

As a result, two bus lines may be removed or omitted from a four-layer structure as shown in FIG. 5. This means that the number of through-silicon vias is reduced in proportion to the number of the removed or omitted bus lines. In FIG. 5, there is exemplarily illustrated an example where two channels use one shared bus. As is shown in FIG. 5, four channels can use a shared bus.

In FIG. 5, reference symbols C1, C2, C3, and C4 may represent four channels, respectively. The term "channel" may be used to indicate that a command signal and an address signal are received independently and data is output independently.

As a result, a through-silicon via number per die may be reduced. A through-silicon via will be more fully described with reference to FIG. 6.

Figure 6:
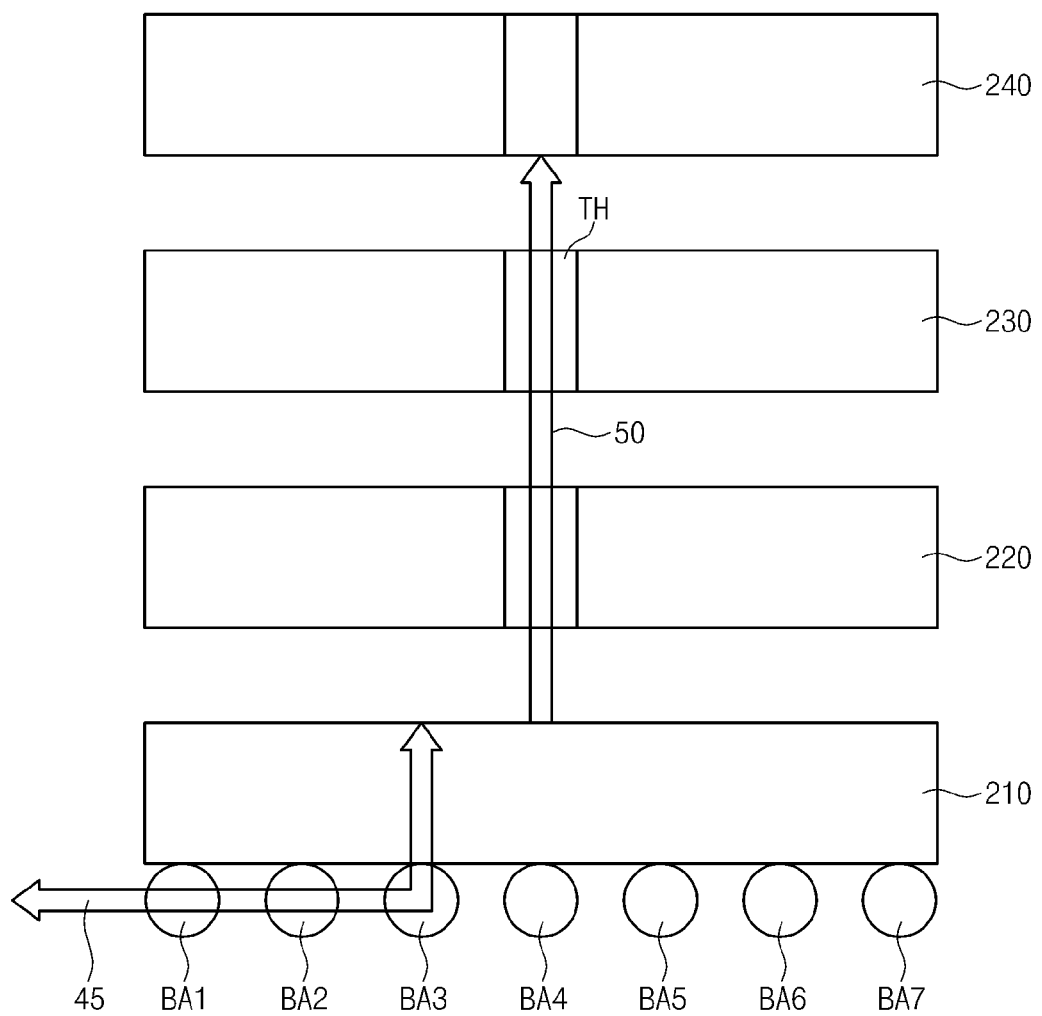
FIG. 6 is a diagram showing an exemplary embodiment of a through-silicon via penetrating four memories, according to aspects of the inventive concept.

FIG. 6 is a diagram showing an exemplary embodiment of a through-silicon via penetrating four memories, as a portion of a memory device, according to aspects of the inventive concept.

Referring to FIG. 6, a semiconductor memory device 200 or 201 may include channel memories 210, 220, 230, and 240 disposed in a four-layer stack structure, such as descried with respect to FIG. 5. A through-silicon via 50 may be formed to penetrate the second, third and fourth channel memories to transfer signals applied through a bus line 45 to the fourth channel memory 240. Accordingly, a via hole TH may be formed to vertically penetrate silicon dies of the second to fourth channel memories 220, 230 and 240. An increase in the number of through-silicon vias formed at the via hole TH may cause a decrease in a yield and an increase in a cost. Further, this may act as an overhead factor in a chip design. Accordingly, it is possible to reduce or minimize the number of through-silicon vias by enabling channel memories to share lines for transferring a row command signal or a row address signal, in accordance with the inventive concept.

The through-silicon via technique may be applied to a semiconductor package forming process to facilitate an electronic system becoming lighter, thinner, shorter, and smaller. A low resistance metal may be used as a main material of the through-silicon via. As an example, copper may be mainly used as a main material of the through-silicon via.

In FIG. 6, the bus line 45 may be a line for transferring a command signal, an address signal, or data. For ease of illustration, balls for electrical connection with a substrate of the first memory 210 may be arranged to form a ball grid array (BGA). Other types of connections may be used in other embodiments. The first memory 210 may be placed at the lowermost part of the stacked memory structure.

In an exemplary embodiment of the inventive concept, channel memories may share a bus for transferring a row command signal or a bus for transferring a row address signal. This is because a minimum margin between applied column commands is tighter than that between applied row commands when a column command transfer line or a column address transfer line is not shared by channel memories. This will be more fully described with reference to FIG. 7.

Figure 7:
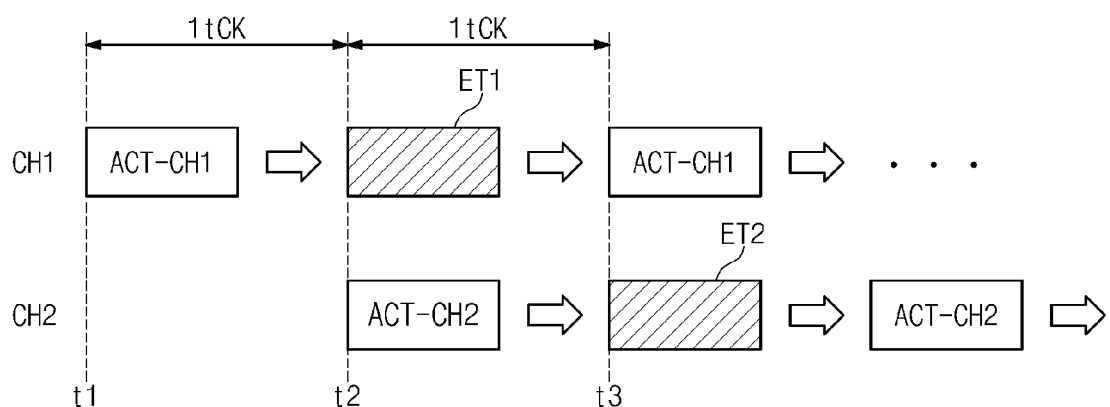
FIG. 7 is a timing diagram used for describing an embodiment of an operation of a semiconductor device using a shared bus, according to aspects of the inventive concept.

FIG. 7 is a timing diagram used for describing an embodiment of an operation of a semiconductor device using a shared bus, according to aspects of the inventive concept.

It is assumed that tCK, which is the duration of one clock cycle, of a double data rate (DDR) DRAM is 2 ns (nanoseconds) and a burst length (BL) thereof is 2. With this assumption, a minimum delay between column address strobe (CAS) commands on the same channel is 1 tCK (or 1×tCK), and a minimum delay between row address strobe (RAS) commands is 2tCK. That is, tRRD may become 4 ns. tRRD is the RAS-to-RAS delay, which is the amount of cycles that it takes to activate the next bank of memory. CAS controls the amount of time, in cycles, between sending a reading command and the time to act on it. From the beginning of the CAS to the end of the CAS is the latency. Generally speaking, the lower the time of these in cycles, the higher the memory performance.

Referring to an interval between points of times t2 and t3, no RAS command may be applied to the first memory 210 in channel CH1. That is, a bubble period ET1 may arise. It is possible to use a shared bus by applying a row command and a row address of the second memory 220 during the bubble period ET1. As a result, in a multi-channel TSV type of DRAM, a bubble period may arise between RAS commands, so that an RAS command bus can be shared by two channel memories. In FIG. 7, RAS commands on the first channel CH1 are denoted as "ACT-CH1" and RAS commands on the second channel CH2 are denoted as "ACT-CH2."

RAS and CAS commands of a specific multi-channel semiconductor memory device may be divided. If a bus for transferring a CAS command is shared, the performance may be lowered due to a relatively tight bubble period. However, it is possible to share a bus for transferring an RAS command through the above-described bubble period. In FIG. 7, a bubble period ET2 may represent a bubble period on the second memory 220 and be set to 1 tCK. As a result, it is possible to reduce the number of through-silicon vias by using a bubble period on a row command having a minimum margin of 2tCK. Meanwhile, although a margin between CAS commands is more than a margin sufficient to provide a command on two-channels, a bus for transferring a CAS command may be shared as illustrated in FIGS. 3 and 4, as an example.

For use of the bubble period, the first control unit 110 driving the first memory 210 may apply a row command (active and pre-charge commands) on the first channel and a row address on the first channel through a shared bus L2 during the first period. The second control unit 120 driving the second memory 220 may apply a row command (active and pre-charge commands) on the second channel and a row address on the second channel through the shared bus L2 during the second period not overlapped with the first period. This is consistent, for example, with FIGS. 1 and 2 discussed above.

Figure 8:
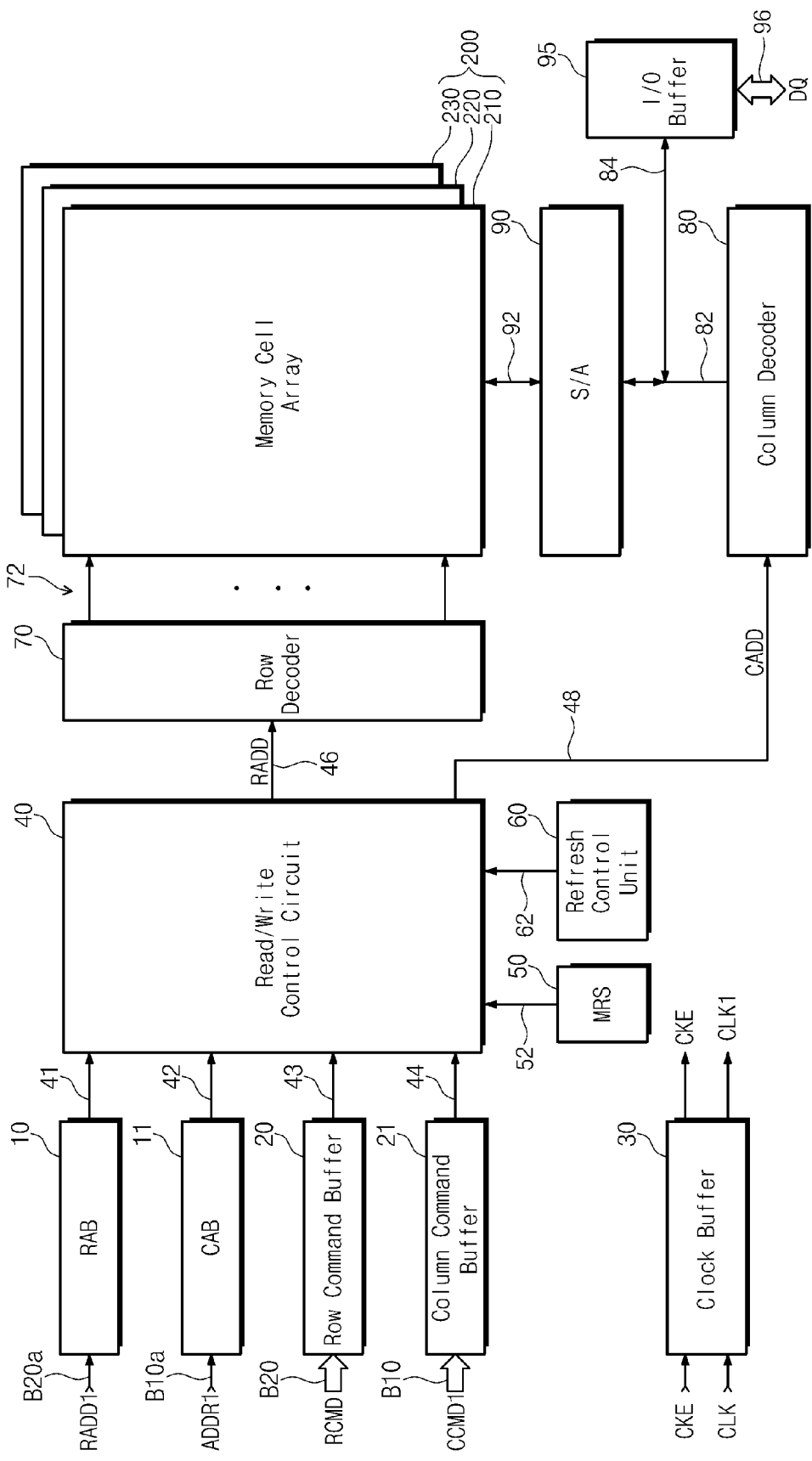
FIG. 8 is a block diagram of an exemplary embodiment of the first or second memory in FIGS. 1 to 4, according to aspects of the inventive concept.

FIG. 8 is a block diagram of an exemplary embodiment of the first or second memory in FIGS. 1 to 4, according to aspects of the inventive concept.

Referring to the embodiment of FIG. 8, the first memory 210 may include a row address buffer 10, a column address buffer 11, a row command buffer 20, a column command buffer 21, a clock buffer 30, an mode register (MRS) circuit 50, a refresh control unit 60, a read/write control circuit 40, a row decoder 70, a column decoder 80, a memory cell array 200, a sense amplifier (S/A) 90, and an input/output (I/O) buffer 95.

In FIG. 8, the row address buffer 10, the column address buffer 11, the row command buffer 20, and the column command buffer 21 of the channel memory 210 may receive a row address RADD1, a column address ADDR1, a row command RCMD, and a column command CCMD1 via buses B20a, B10a, B20, and B10, respectively.

The channel memory 210 in FIG. 8 may not have an address multiplexing structure, but rather an address input structure where row and column addresses are received through separate buses. Likewise, a row command and a column command may be applied through separate buses to the channel memory 210. This signal input structure may be more powerful than a structure for controlling channel memories independently.

Herein, the row command may include an active command and a pre-charge command, and the column command may include a write command and a read command.

A chip selection signal /CS, a row address strobe signal /RAS, a column address strobe signal /CAS, and a write enable signal /WE may be applied through respective lines 41-43 to generate the row and column commands. The read/write control circuit 40 may be configured to decode commands or signals.

The memory cell array 200 may include a plurality of word lines 72 arranged in a row direction, a plurality of bit lines 92 arranged in a column direction, and a plurality of memory cells arranged at intersections of the plurality of word lines and the plurality of bit lines. Each memory cell may be formed of a volatile memory cell which consists of an access transistor and a storage capacitor. The memory cell array 200, for example, may be formed of a plurality of memory banks, for example memory banks 210, 220 and 230. The memory cell array 200 is not limited to three memory banks, more or less memory banks could be provided.

The mode register MRS 50 controls the operations of the read/write control circuit 40 via line 52. The refresh control unit 60 may be connected with the read/write control circuit 40 and generate a refresh control signal for a refresh operation.

The read/write control circuit 40 may control when data is read out from selected memory cells of the memory cell array 200 and when data is written in selected memory cells of the memory cell array 200. The read/write control circuit 40 may generate a row address signal RADD and a column address signal CADD according to the commands received from row command buffer 20 and column command buffer 21. Further, the read/write control circuit 40 may control refreshing of memory cells in response to the refresh control signal transferred via a line 62. The read/write control circuit 40 may receive a clock signal CLK and a clock-enable signal CKE, which are buffered by the clock buffer 30.

The row decoder 70 may decode the row address signal RADD received via line 46 to select a row of the memory cell array 200. The column decoder 80 may decode the column address signal CADD received via line 48 to select a column of the memory cell array 200.

The sense amplifier 90 may sense and amplify a voltage developed on a bit line to read data stored in a selected memory cell of the memory cell array 200. The sense amplifier 90 and column decoder 80 may communicate via line 82. The input/output buffer 95 may receive data to be stored in memory cells. Data provided from the sense amplifier 90 may be output through the input/output buffer 95 and an input/output terminal DQ via bus 96. The sense amplifier 90 and input/output buffer 95 may communicate via line 84.

Figure 9:
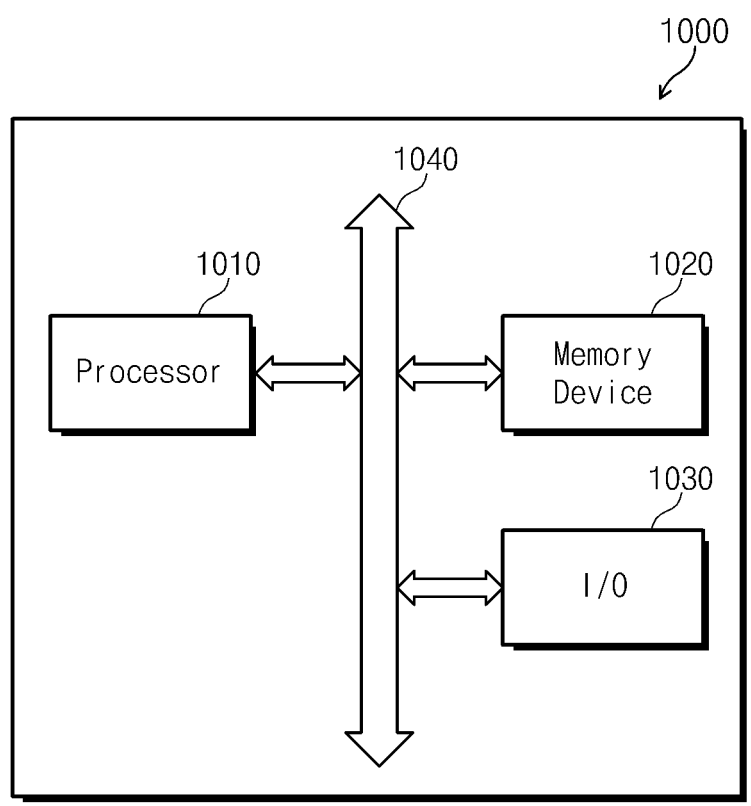
FIG. 9 is a block diagram of an exemplary embodiment of a data processing device, according to aspects of the inventive concept.

FIG. 9 is a block diagram of an embodiment of a data processing device, according to aspects of the inventive concept.

Referring to FIG. 9, a data processing device 1000 may include a processor 1010, a memory device 1020, and an input/output device 1030.

The memory device 1020 may include a semiconductor memory device according to an exemplary embodiment of the inventive concept. Herein, the memory device 1020 can be configured to have a three-dimensional stack structure as illustrated in FIG. 5, as an example. The memory device 1020 may include a memory and a memory controller, as in FIGS. 1-5. The processor 1010 may control the memory device 1020 and the input/output device 1030 through a system bus 1040.

In FIG. 9, it is assumed that a DRAM device in FIG. 5, according to an exemplary embodiment of the inventive concept, is provided within the memory device 1020. With this assumption, a row command or a row address may be applied in common to stacked memories through a shared bus. Accordingly, it is possible to improve a yield of a memory device and to reduce a fabrication cost.

Figure 10:
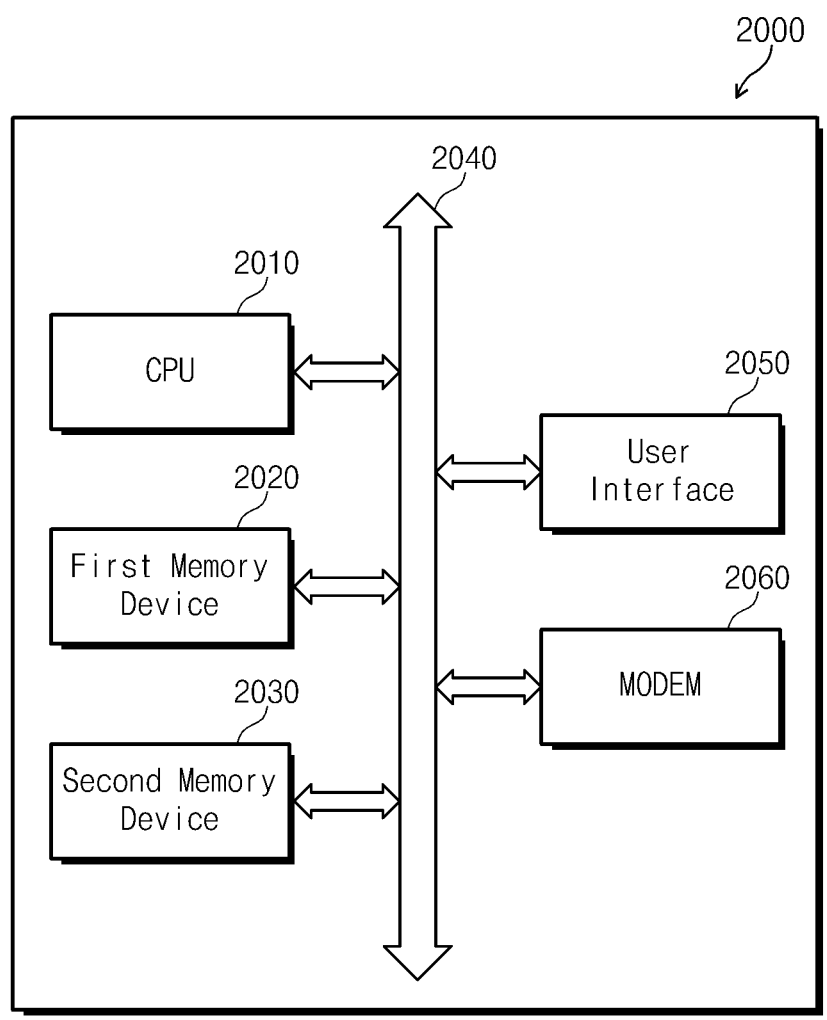
FIG. 10 is a block diagram of an exemplary embodiment of a computing system, according to aspects of the inventive concept.

FIG. 10 is a block diagram of an exemplary embodiment of a computing system, according to aspects of the inventive concept.

Referring to FIG. 10, a computing system 2000 may include a CPU 2010, a first memory device 2020, a second memory device 2030, a user interface 2050, and a modem 2060, such as a baseband chipset which are electrically connected with a system bus 2040. One or both of the first memory device 2020 and the second memory device 2030 can each take the form of the memory device 1020 of FIG. 9.

If the computing system 2000 is a mobile device, it may further include a battery (not shown) which powers the computing system. Although not illustrated in FIG. 10, the computing system 2000 may further include an application chipset, a camera image processor (CIP), a mobile DRAM, and the like. Such mobile devices can include a cellular telephone, personal digital assistance, a portable music and/or video player, an electronic tablet, pad, or book reader, a portable navigation or global positioning system (GPS) device, a laptop computer, and the like.

In various embodiments, one of the first memory device 2020 and the second memory device 2030 may constitute a solid state drive (SSD) which uses a non-volatile memory to store data, for example. Alternatively, in other embodiments, the first memory device 2020 or the second memory device 2030 may be formed of a fusion flash memory (e.g., a memory including an SRAM buffer, a NAND flash memory, and NOR interface logic).

In FIG. 10, it is assumed that the other of the first memory device 2020 and the second memory device 2030 is formed of a volatile memory according to an exemplary embodiment of the inventive concept. In this case, a row command signal or a row address signal may be applied to stacked memories through a shared bus, so that the number of through-silicon vias is reduced. As a result, it is possible to improve a yield of a memory device and to reduce a fabrication cost.

A volatile memory device and/or a controller according to an exemplary embodiment of the inventive concept may be packed in various types of packages, such as PoP (Package-on-Package), BGAs (Ball grid arrays), CSPs (Chip scale packages), PLCC (Plastic Leaded Chip Carrier), PDIP (Plastic Dual In-Line Package), Die in Waffle Pack, Die in Wafer Form, COB (Chip On Board), CERDIP (Ceramic Dual In-Line Package), MQFP (Plastic Metric Quad Flat Pack), TQFP (Thin Quad Flatpack), SOIC (Small Outline Integrated Circuit), SSOP (Shrink Small Outline Package), TSOP (Thin Small Outline Package), TQFP (Thin Quad Flatpack), SIP (System In Package), MCP (Multi Chip Package), WFP (Wafer-level Fabricated Package), WSP (Wafer-Level Processed Stack Package), and the like.

The MCP may include a volatile memory in a RAM family and a non-volatile memory in a ROM family, either independently or together. Herein, the volatile memory may include at least one of mobile DRAM, EDP, PRAM, OneDRAM, Pseudo SRAM, LpDDR family DRAM, FRAM, Graphic DRAM, and ReRAM, as examples. The non-volatile memory may include at least one of NAND flash, NOR flash, OneNAND, PRAM, and ReRAM, as examples.

The above-disclosed subject matter is to be considered illustrative, and not restrictive, and the appended claims are intended to cover all modifications, enhancements, and other embodiments that fall within the true spirit and scope of the inventive concept. Thus, to the maximum extent allowed by law, the scope the claims is to be determined by the broadest permissible interpretation of the following claims and their equivalents, and shall not be restricted or limited by the foregoing detailed description.

What is claimed is:

1. A multi-channel semiconductor memory chip comprising:
   a first channel memory area configured to receive a first channel command signal through a shared bus during a first time period and receive a first data signals through a first data bus; and
   a second channel memory area configured to receive a second channel command signal through the shared bus after the first time period and receive a second data signals through a second data bus,
   wherein the first channel command signal is applied to the first channel memory area through the shared bus, and the second channel command signal is applied to the second channel memory area different from the first channel memory area in the multi-channel semiconductor memory chip through the shared bus,
   wherein the first a data bus is connected to a first control unit, the second data bus is connected to a second control unit, and the shared bus is commonly connected to the first control unit and the second control unit,
   wherein the first data bus provides the first channel memory area with a first column command and a first column address, the second data bus provides the second channel memory area with a second column command and a second column address, and the shared data bus provides both the first channel memory area and the second channel memory area with a first row command and first row addresses.

2. The multi-channel semiconductor memory chip of claim 1,
   wherein the second channel memory area configured to receive the second channel command signal through the shared bus during a second time period that is not overlapped with the first time period.

3. The multi-channel semiconductor memory chip of claim 1,
   wherein the first channel command is a row command or a column command.

4. The multi-channel semiconductor memory chip of claim 2,
   wherein the row command is an active command or a precharge command.

5. The multi-channel semiconductor memory chip of claim 2,
   wherein the column command is a read command or a write command.

6. The multi-channel semiconductor memory chip of claim 1,
   wherein the first data bus and the second data bus are configured to have 128 data bits respectively.

7. The multi-channel semiconductor memory chip of claim 1, further comprising:
   the first channel memory area configured to receive a first channel address signal through the shared bus and the second channel memory area configured to receive a second channel address signal through the shared bus.

8. The multi-channel semiconductor memory chip of claim 1,
   wherein the first data bus is separated from the second data bus.

9. An operating method of a multi-channel semiconductor memory chip comprising:
   providing a first channel memory area and a second channel memory area different from the first channel memory area;
   providing a first control unit connected to the first channel memory area via a first data bus and a second control unit connected to the second channel memory area via a second data bus, wherein the shared bus is commonly connected to the first control unit and the second control unit;
   applying a first channel command signal and a first address signal from the first control unit through a shared bus to operate the first channel memory area during a first time period;
   applying a second channel command signal and a second address signal from the second control unit through the shared bus to operate the second channel memory area after the first time period;
   receiving or transmitting a first channel data signal of the first channel memory area through a first data bus; and
   receiving or transmitting a second channel data signal of the second channel memory area through a second data bus.

10. The operating method of claim 9,
    wherein the second channel memory area configured to receive the second channel command signal through the shared bus during a second time period that is not overlapped with the first time period.

* * * * *